(12) United States Patent
Lauffer et al.

(10) Patent No.: US 7,530,167 B2
(45) Date of Patent: May 12, 2009

(54) METHOD OF MAKING A PRINTED CIRCUIT BOARD WITH LOW CROSS-TALK NOISE

(75) Inventors: John M. Lauffer, Waverly, NY (US); Voya R. Markovich, Endwell, NY (US); James J. McNamara, Jr., Vestal, NY (US); David L. Thomas, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 240 days.

(21) Appl. No.: 11/634,287

(22) Filed: Dec. 6, 2006

(65) Prior Publication Data

US 2007/0089290 A1    Apr. 26, 2007

Related U.S. Application Data

(60) Division of application No. 10/740,398, filed on Dec. 22, 2003, now Pat. No. 7,176,383, which is a continuation-in-part of application No. 10/354,000, filed on Jan. 30, 2003, now Pat. No. 6,828,514.

(51) Int. Cl.
*H01K 3/10* (2006.01)

(52) U.S. Cl. .............................. 29/852; 29/825; 29/830; 29/832

(58) Field of Classification Search .................. 29/825, 29/830, 832
See application file for complete search history.

(56) References Cited

U.S. PATENT DOCUMENTS

| | | | |
|---|---|---|---|
| 5,272,600 A * | 12/1993 | Carey ......................... 361/792 |
| 5,649,160 A | 7/1997 | Corry et al. |
| 6,020,614 A | 2/2000 | Worley |
| 6,184,477 B1 * | 2/2001 | Tanahashi .................... 174/261 |
| 6,198,635 B1 * | 3/2001 | Shenoy et al. ............... 361/760 |
| 6,218,631 B1 * | 4/2001 | Hetzel et al. ................ 174/261 |
| 6,388,200 B2 * | 5/2002 | Schaper ...................... 174/255 |
| 6,429,752 B1 | 8/2002 | Harju et al. |
| 6,429,757 B1 | 8/2002 | Karlsson et al. |
| 6,441,470 B1 * | 8/2002 | Shenoy ....................... 257/659 |
| 6,501,058 B2 | 12/2002 | Jung |
| 6,522,214 B1 | 2/2003 | Harju et al. |
| 6,529,229 B2 | 3/2003 | Nagumo |
| 6,750,403 B2 * | 6/2004 | Peterson ..................... 174/255 |
| 6,909,052 B1 * | 6/2005 | Haug et al. .................. 174/255 |
| 2002/0100613 A1 | 8/2002 | Anstrom et al. |
| 2002/0108780 A1 * | 8/2002 | Blackwell et al. |
| 2002/0148637 A1 * | 10/2002 | Anstrom et al. ............. 174/255 |
| 2005/0121766 A1 * | 6/2005 | Devnani et al. ............. 257/691 |

* cited by examiner

*Primary Examiner*—C. J Arbes
(74) *Attorney, Agent, or Firm*—Mark Levy; Lawrence R. Fraley; Hinman, Howard & Kattell

(57) ABSTRACT

A method of making a printed circuit board in which the board includes a common power plane having dielectric layers on opposing sides thereof and a signal layer on each of said dielectric layers, each signal layer comprising a plurality of substantially parallel signal lines running in substantially similar directions across said signal layers. Predetermined portions of the signal lines in one signal layer are aligned relative to and also parallel to corresponding signal lines in the other signal layer, with the power plane being located between these portions. Through hole connections are provided between selected signal lines in the two layers, these occurring through clearance holes in the power plane so as to be isolated therefrom.

10 Claims, 2 Drawing Sheets

FIG. 2
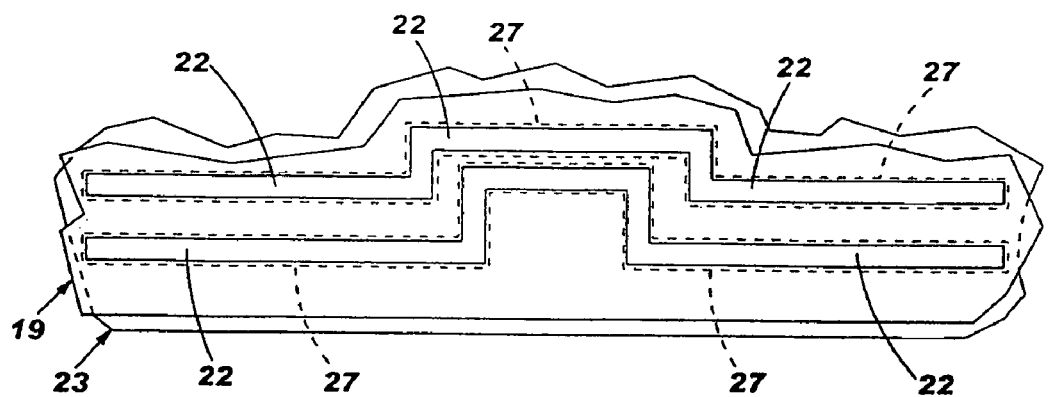
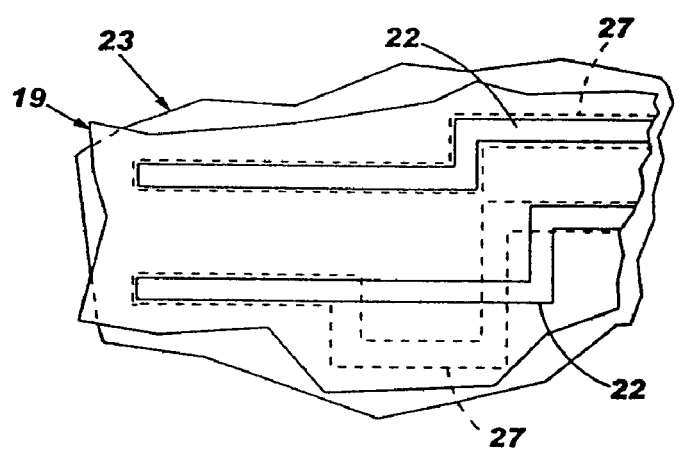
FIG. 3
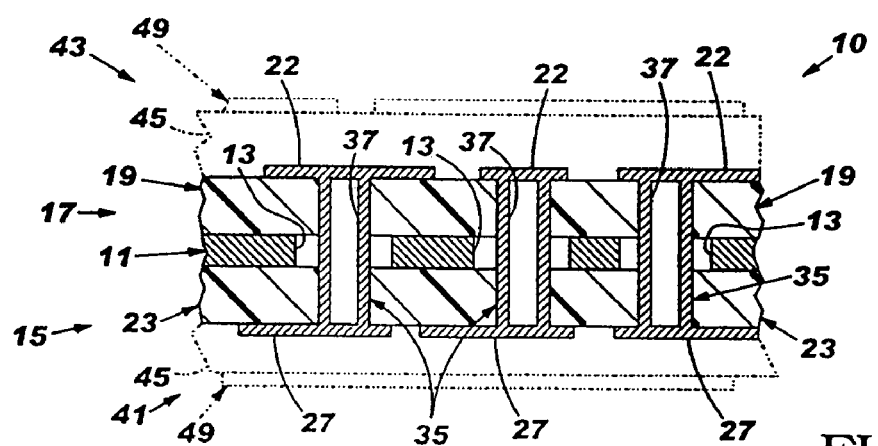
FIG. 4

METHOD OF MAKING A PRINTED CIRCUIT BOARD WITH LOW CROSS-TALK NOISE

CROSS REFERENCE TO CO-PENDING APPLICATIONS

This application is a divisional application of Ser. No. 10/740,398, filed Dec. 22, 2003, now U.S. Pat. No. 7,176,383 which is a continuation-in-part application of Ser. No. 10/354,000, filed Jan. 30, 2003. Ser. No. 10/354,000 is now U.S. Pat. No. 6,828,514.

TECHNICAL FIELD

The invention relates to printed circuit (or wiring) boards and particularly to such boards which are adapted for processing high speed signals across various planes thereof.

BACKGROUND OF THE INVENTION

Due to technological advances, the need for higher speed circuitries in printed circuit boards (PCBs) have arisen, in turn giving rise to the need for higher speed digital signal transmissions. If not properly implemented, the reduction in the rise and fall time of high-frequency digital signals propagating within the PCB may lead to a compromise in signal integrity, for example cross-talk noise and signal distortions due to impedance mismatch. As the clock frequency of the signal increases, more energy is distributed over the higher frequency spectrum which consequently creates a greater demand for a larger bandwidth.

At low frequencies, a signal path on a PCB may be represented electrically as a lumped network of series resistances and shunt capacitances. However, as the frequency is increased, this approach of lumped circuit modeling breaks down, and signal paths must be regarded as transmission lines. The commonly used PCB transmission line structures are microstrip, embedded microstrip, stripline and dual striplines. The microstrip configuration simply refers to the case where the conductor is separated from a reference plane, either ground or power, by a dielectric. The stripline configuration, on the other hand, has reference planes above and below the conductor. A typical multilayer PCB of more than two signal layers, then, may have both stripline and microstrip geometries.

As defined herein, the present invention is directed at reducing and substantially eliminating cross-talk noise between conductive layers in a multilayered PCB. Crosstalk, as is known, is a category of noise induced primarily by the electromagnetic coupling between signal lines. In PCBs, crosstalk can occur by the electrical coupling between relatively closely spaced signal traces (lines). Crosstalk decreases noise margins and degrades signal quality. This, of course, can be a major limiting factor in communication systems performance. Crosstalk increases with longer trace coupling distances, smaller separation between traces, shorter pulse rise and fall times, larger magnitude currents or voltages being switched.

Two types of signal coupling determine the amount of crosstalk in a circuit: inductive coupling and capacitive coupling. These two types of coupling decrease with increasing distance between source and receiver. Most crosstalk can be attributed to adjacent wires. Because parallel and adjacent wires on a PCB layer interact both capacitively and inductively, the distance over which adjacent wires are parallel needs to be carefully controlled. To minimize crosstalk, some high frequency designs incorporate ground planes under each signal layer, which have proven to virtually eliminate the crosstalk. Ideally, then, crosstalk between neighboring signals can be reduced by maximizing signal-to-signal spacing and by minimizing signal-to-ground distances.

These factors, plus a host of others, contain many interdependencies and are often at odds with one another. For example, high wiring density is required to minimize interconnect delays as well as size, cost and weight. However, as signal lines are placed closer together, their mutual coupling increases, with a corresponding rise in crosstalk levels.

Therefore, the design of PCBs has become quite a challenging task, especially when designing high-performance and high-density boards. Most significantly, electromagnetic coupling between the interconnects (signal traces) is one factor that sets the upper limit to the interconnect density.

In one multilayered PCB, the board includes a first layer having an electrically conductive plane for electrical connection to a common armature contact of a relay, the electrically conductive plane being sized to substantially cover a mounting footprint of the relay. This PCB also includes a second layer parallel to and electrically separate from said first layer, the second layer having an electrically conducting first section for electrical connection to a normally-open contact of the relay and an electrically conducting second section for electrical connection to a normally-closed contact of the relay, the first and said second sections being electrically separate from each other and in combination with each other being planar and sized to substantially cover the mounting footprint of the relay.

In U.S. Pat. No. 6,529,229, first and second clock signal lines are preferably mutually adjacent, and preferably weave around electrode pads and/or wiring patterns used to interconnect the driver ICs. The preferred even-odd variation of the interconnections between the driver integrated circuits (ICs) and the clock signal lines facilitates the mutually adjacent weaving layout of the clock signal lines, which improves their noise immunity. The clock signal lines preferably include in-line electrode pads to which the clock input terminals of the driver ICs are coupled. The in-line electrode pads reduce reflection of the clock signals because they avoid characteristic-impedance discontinuities.

When coupling semiconductor devices (integrated circuits or chips), including those of the multi-mode variety (analog and digital) onto PCBs, various attempts have been utilized to reduce noise generation and the associated problems. One attempt to solve the noise problem involves the addition of decoupling capacitors placed near the active devices. The decoupling capacitors stabilize the current flowing to these devices. However, while the capacitor absorbs some of the voltage, a spike still occurs.

Yet another attempt to manage switching noise in multi- or mixed-mode structures involve partitioning analog and digital functions. This process requires unique manufacturing processes and custom designs. For example, U.S. Pat. No. 6,020,614 suggests that noise can be reduced by establishing boundary zones between the analog and digital circuits of a semiconductor substrate with the analog circuit having a separate power supply bus from the digital circuit. Further, this patent mentions providing interconnect signal lines such that the isolated wires between the circuits may functionally interact with other circuits while the substrate noise coupling from other circuits remains low. However, spacing the analog components from the digital components can waste precious semiconductor space, which is an important consideration in integrated circuit (and PCB) design.

Still another attempt to resolve switching noise problems in a multi-mode structure is addressed in U.S. Pat. No. 5,649, 160. This patent suggests that the noise can be reduced by shaping the noise from the digital circuit and concentrating it in a single or a small number of parts of the frequency spectrum. This solution relies on the concept that the presence of noise in the analog circuit is less important at certain frequencies, and therefore the spectral peak or peaks from the digital circuit can be carefully placed to result in little or no interference.

Still further approaches for arranging transmission lines on microwave circuit structures are described in U.S. Pat. Nos. 6,429,752, 6,429,757 and 6,522,214.

Finally, in U.S. Pat. No. 5,031,073, there is described a PCB in which the board's circuitry is partitioned into a plurality of circuit regions which are selectively isolated with respect to input and output signals. Signal lines in one region are arranged in a closely spaced array aligned with, but spaced from, a corresponding array in an adjacent region.

Other examples of various PCB multilayered structures are shown and described in U.S. Published Patent Applications US2002/0108780 A1, US 2002/0148637 A1 and US 2002/0100613 A1, the teachings of which are incorporated herein by reference, as are the teachings of the other documents cited in this Background.

As defined hereinbelow, the present invention defines a new and unique PCB design in which cross-talk is substantially eliminated between conductive layers while permitting high speed signal passage across various signal planes in the final structure. Such a PCB design as taught herein, is of simpler construction and operates more expeditiously than many of those described above, is relatively less expensive to manufacture than same, and thus represents a significant advancement in the PCB art.

DISCLOSURE OF THE INVENTION

It is a primary object of the present invention to enhance the PCB art.

It is another object of the invention to provide a method of making a PCB which is capable of operating effectively with a minimum of crosstalk while still allowing high density wiring patterns, if desired, e.g., to couple electronic packages such as chip carriers thereto.

It is another object of the invention to provide a method of making a PCB which can be implemented using present technology and at comparative costs to present methods used to manufacture less complex boards.

According to one aspect of the invention, there is provided a printed circuit board comprising a power plane having first and second opposing sides, first and second dielectric layers located on the first and second opposing sides of the power plane, respectively and first and second signal layers located on the first and second dielectric layers, respectively, each of these signal layers including a plurality of substantially parallel signal lines running in a substantially similar direction across the signal layers from a first side of said signal layer to a second side of said signal layer. At least a large portion of the number of signal lines in the first signal layer are aligned with and substantially parallel to a corresponding large portion of signal lines in the second signal layer. The power plane located substantially between these large portions of aligned and substantially parallel signal lines substantially reduces crosstalk between the first and second signal layers.

According to another aspect of the invention, there is provided a method of making a printed circuit board comprising the steps of providing a power plane having first and second opposing sides, positioning the first and second dielectric layers on the first and second opposing sides of the power plane, respectively, and positioning first and second signal layers on the first and second dielectric layers, respectively. Each of the signal layers includes a plurality of substantially parallel signal lines running in a substantially similar direction across the signal layer from a first side of the signal layer to a second side of the signal layer. At least a large portion of the number of signal lines in the first signal layer are aligned with and substantially parallel to a corresponding large portion of signal lines in the second signal layer, and the power plane is located substantially between these large portions of aligned and substantially parallel signal lines. The result is to substantially reduce crosstalk between the first and second signal layers in the final board product.

BRIEF DESCRIPTION OF THE DRAWINGS

FIG. 2 is a partial plan view illustrating the relative positioning between the signal lines on one signal layer of the embodiment in FIG. 1 and the signal lines on the opposing signal layer;

FIG. 3 is also a partial plan view, illustrating relatively minor situations in which portions of the signal lines in one signal plane may not be aligned with portions of signal lines in the other signal plane while still achieving the significant advantageous results of the instant invention; and FIG. 4 is a partial side elevational view, in section, showing the PCB of FIG. 1 having a plurality of through holes (or internal vias if the structure in FIG. 4 further include additional signal and/or conductive, e.g., signal, power or ground, layers to form a much larger multilayered PCB. Two of such additional layers are shown in phantom in FIG. 4.

BEST MODE FOR CARRYING OUT THE INVENTION

Figure 1:
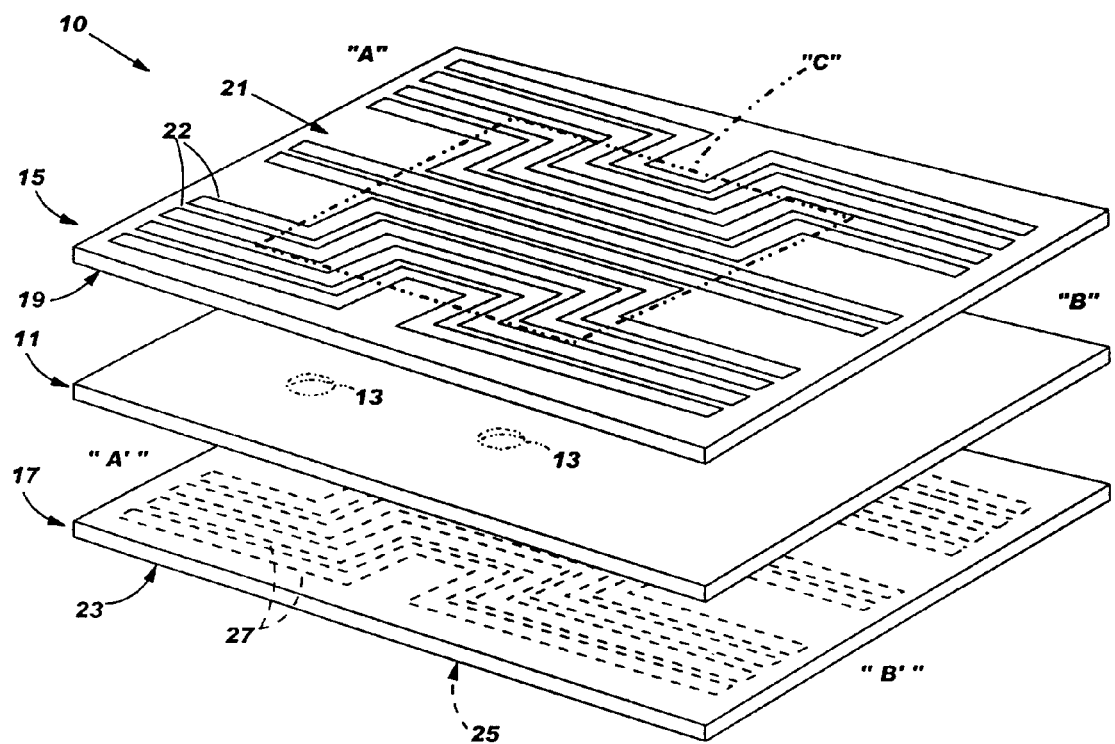
FIG. 1 is an exploded, perspective view of two signal layers and an interim power plane which form part of a PCB according to one embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

In FIG. 1, there is shown a printed circuit board (PCB) 10 according to one aspect of the invention. As will be understood from the following description, the resulting structure as defined herein is a PCB with requirements for predominantly singular direction wiring with a reduced number of signal layers having at least equivalent electrical performance to PCBs of the known art, including those of more complex construction. The structure as defined herein allows for internal connections (e.g., internal or "buried" vias to connect adjacent signal layers through the interim power plane) if the structure is to form part of a larger, multilayered PCB. The structure as shown in FIG. 1 comprises what may be referred to as a two signal and one power (2S1P) structure (or core) if used in combination with additional signal, ground and/or power layers to form a larger structure. Although the structure shown in FIG. 1 defines a pair of signal layers having wiring passing from one side to the other in a substantially parallel, aligned orientation (explained hereinbelow), it is not essential that the remaining signal or other conductive layers in a larger multilayered structure operate in this manner. The advantages defined herein, substantially reduced cross-talk noise between adjacent signal layers, are attained with such a singular direction structure and can be achieved in only a portion of a larger structure or, if desired, at more portions than those shown, e.g., wherein more than one structure such as that shown in FIG. 1 are formed into the resulting multilayered structure.

The structure shown in FIG. 1 comprises a plurality of layers and is preferably formed using conventional lamination techniques in which specified pressures and temperatures are utilized. Similarly, if additional signal, ground and/or power layers are desired, these may be simply arranged in a stacked orientation and simultaneously laminated with the layers in FIG. 1. The invention is thus able to be produced using conventional or known lamination processes in the PCB field. In one example of the invention, temperature from about 175 degrees Celsius to about 250 degrees Celsius and pressures from about 100 pounds per square inch to about 1,100 pounds per square inch are possible.

Therefore, the structure shown in FIG. 1 in its simplest form may comprise the 2S1P construction but in a more likely construction, will represent a core structure or the like as part of a much thicker, multilayered PCB.

PCB 10 includes a power plane 11 which, in a preferred embodiment, is a substantially solid sheet of copper having a thickness of from about 0.001 inch to about 0.003 inch. Although shown of substantially solid construction, the power plane will preferably include clearance openings 13 (two examples shown in phantom in FIG. 1) for the purpose of allowing through hole or internal via electrical connection between opposing signal lines on the PCB's opposed signal layers. An example of three such connections are shown in FIG. 4.

In FIG. 1, PCB 10 further includes first and second signal planes 15 and 17 respectively. Signal plane 15 comprises a dielectric layer 19 having thereon a signal layer 21 comprised of several individual signal lines extending across the dielectric layer. It is understood that the pattern shown is not limitive of the invention and that other patterns are acceptable to still achieve the results desired herein. The second signal plane also comprises a dielectric layer 23 and a signal plane 25 (shown hidden) comprised of a pattern of signal lines 27 located on the under surface of dielectric layer 23. These lines are also shown hidden because they are hidden from the viewer in FIG. 1.

As shown, the signal lines 22 in FIG. 1 on first signal plane 15 are substantially similar in pattern to those lines 27 on the second signal plane. Additionally, the respective signal lines 22 and 27 extend from similar sides of each signal layer across to the opposing second side. For purposes of illustration, the first side for signal plane 15 is represented by the letter "A" and the second side by the letter "B" while the respective sides for plane 17 are represented by "A'" and "B'". Thus, the signal lines in both planes "run" from sides A and A' to sides B and B', respectively. Further, the signal lines of one plane are substantially parallel to and aligned with the respective signal lines on the opposing plane. By parallel alignment is meant that as shown in FIG. 2 wherein the upper signal lines 22 are shown as being vertically oriented above the lower (hidden) signal lines 27. This represents a significant teaching of the invention because it is believed that such parallel, aligned orientation of at least a major portion of the signal lines on the opposing planes results in the significant cross-talk noise reduction attained by the invention taught herein. Further, portions of some of the lines in each signal plane "run" perpendicular to one another as these lines "run" from side "A" to side "B", as seen when comparing FIG. 1 to both FIGS. 2 and 3.

In a preferred embodiment, each signal plane comprises a dielectric layer, preferably of conventional material (e.g., fiberglass-reinforced polymer resin, also known as "FR4") and the signal lines positioned thereon are preferably of copper having a thickness of about 0.0005 inch to about 0.002 inch. The corresponding thickness for the supporting dielectric layer is preferably from about 0.002 inch to about 0.020 inch, depending on selected line width and desired impedance. The above are not meant to limit the invention, however, because other materials and thicknesses are possible to still achieve the results desired herein. For example, it is within the scope of the invention to use an alternative dielectric material, e.g., Teflon (a trademark of E.I. duPont deNemours and Company) or a material sold by the assignee of the present invention under the name Driclad (a trademark of Endicott Interconnect Technologies, Inc.). Other materials are also possible.

Each of the signal lines are preferably formed on the respective supporting dielectric layer using conventional photolithographic processing known in the art and further description is not believed necessary.

In the construction shown in FIG. 1, the resulting PCB is adapted for having at least one electronic package (e.g., a chip carrier such as one sold under the name HyperBGA by the assignee of the present invention. HyperBGA is a trademark of Endicott Interconnect Technologies, Inc. Such a chip carrier or electronic package would be positioned in the approximate location illustrated by the substantially rectangular pattern "C" in FIG. 1. As such, the package would be electrically connected to selected ones of the underlying signal lines of plane 15, either directly or through additional layers if the structure in FIG. 10 is to be part of a larger, thicker multilayered PCB. It is also understood that the pattern of signal lines shown in FIG. 1 would be somewhat different than that shown in that various separate pads (not shown) or other terminations of the lines within pattern "C" may be desired for individual connections to corresponding conductive sites of the respective positioned package. Again, the patterns depicted in FIG. 1 are representative only and not meant to limit the invention.

Although FIG. 2 depicts the opposed signal line patterns to be parallel and aligned throughout their entire length, the invention is not so limited. Specifically, it is only important that a portion of these lines be parallel and aligned in the vertical orientation defined herein. FIG. 3 represents one example wherein a minor portion of the underlying signal line 27 departs from the path of the overlying upper signal line 22 across a short distance thereof. By the term large (or major) portion of the opposed lines being parallel and aligned is meant to define a percentage range in which the total length of the lines directly overlap. In one example of the invention, this range is from about 5 percent to about 95 percent. In a specific example, 25 percent of the lines in each pattern were aligned directly adjacent one another and parallel thereto as taught herein.

In FIG. 4, there is shown a partial side elevational view, in section, showing the structure 10 of FIG. 1. As shown therein, three through holes 35 are utilized to electrically connect respective signal lines 22 on the upper signal plane 15 to corresponding signal lines 27 on the lower signal plane. It is also seen in FIG. 4 that these lines 22 and 27 are aligned substantially above and below one another and thus in the orientation described above. However, it is also shown in FIG. 4 that portions of said lines are not directly above the other, thus representing the slight mismatch in such alignment as depicted in FIG. 3, while still attaining the reduced cross-talk noise between the signal planes in accordance with the teachings herein.

Each conductive through hole 35 represents a hole drilled or otherwise formed (e.g., by laser) through the dielectric material 19 and 23 in each signal plane following which the dielectric layer is plated with a thin conductive layer 37, e.g., copper. It is understood that the illustration of these through holes (or internal, blind vias if additional layers are utilized for structure 10) are not exactly as depicted in FIG. 4. That is, in the working embodiment (final structure) for the invention, portions of the dielectric material 19 and 23 will flow into the clearance openings 13 of the interim power plane 11 such that the subsequent drilling or laser utilization will involve removal of dielectric from these openings. Thus, the illustrated thin conductive lines shown in FIG. 4 will in affect be located on walls of dielectric material within clearance openings 13. Thus, it is seen in FIG. 4 that several electrical connections are attainable between opposed signal lines of structure 10 through a common power plane to attain the unique advantages of the instant invention. In one example of the invention, where additional dielectric and conductive layers were added to produce a much larger (thicker) PCB, about 1,500 internal blind (buried) vias and about 70,000 thru holes (through the entire structure) were used.

As also seen in FIG. 4, the structure of FIG. 10 includes additional layers 41 and 43 (and may include even more such layers if desired), each layer preferably including a dielectric material 45 and a corresponding conductive (e.g., signal) layer 49 thereon. These conductive layers 49 may be in the form of signal, ground and/or power construction and are preferably formed utilizing the aforementioned photolithographic processing known in the art. In a preferred embodiment, these conductive layers are alternating power or ground, then signal, then power or ground, etc., on each opposite side of the initial structure (shown solid in FIG. 4). In a structure as shown in FIG. 4, the internal structure represented in FIG. 1 thus forms only a core or the like member as part of the final, multilayered structure possibly containing several additional dielectric and conductive layers married thereto, e.g., using conventional lamination techniques. As stated, the invention is thus able to be utilized within such a thicker, multilayered structure having many layers to still attain the results taught herein.

There has thus been shown and described a printed circuit board construction which significantly reduces cross-talk noise between adjacent signal lines in which an interim power conductive plane is utilized. The resulting structure substantially reduces cross-talk noise between the planes to result in a final structure capable of operating at both high and low frequencies, the latter especially desirable in today's more complex board technologies. The signal patterns and resulting connecting structures as described herein are possible on a high density basis wherein the adjacent signal lines on one plane may be as closely spaced as only about 0.002 inch apart on the same plane and also while only spaced 0.005 inch from the corresponding signal line on the adjacent, opposing signal layer. This represents a significant advancement in the art, particularly considering that the structure as produced herein may be manufactured using conventional PCB technologies, thus representing a substantially reduced cost product to the end purchaser.

While there have been shown and described what are at present the preferred embodiments of the invention, it will be obvious to those skilled in the art that various changes and modifications may be made therein without departing from the scope of the invention as defined by the appended claims.

What is claimed is:

1. A method of making a printed circuit board, said method comprising:

providing a substantially solid power plane having first and second opposing sides;

positioning first and second dielectric layers on said first and second opposing sides of said substantially solid power plane, respectively;

forming a first signal layer on said first dielectric layer substantially parallel to said substantially solid power plane and including a plurality of substantially parallel signal lines running in a single direction across said first signal layer from a first side of said printed circuit board to a second side of said printed circuit board; and forming a second signal layer on said second dielectric layer also substantially parallel to said substantially solid power plane and including a plurality of substantially parallel signal lines running in the same direction as said signal lines of said first signal layer across said second signal layer from said first side of said printed circuit board to said second side of said printed circuit board and of a substantially similar pattern as said signal lines of said first signal layer such that at least a predetermined large portion of the number of signal lines in said first signal layer are aligned with and substantially parallel to a corresponding large portion of said signal lines in said second signal layer and said power plane is located substantially between said predetermined portions of said aligned and substantially parallel signal lines in order to substantially reduce crosstalk between said first and second signal layers.

2. The method of claim 1 further including providing a plurality of clearance openings within said power plane.

3. The method of claim 2 further including providing a plurality of conductive through holes which each pass through a selected one of said clearance openings in said power plane in an electrically isolated manner from said power plane to electrically connect selected ones of said predetermined portion of signal lines in said first signal layer to corresponding selected ones of said predetermined portion of signal lines in said second signal layer and thereby assuring that said signal lines on both of said first and second signal layers are not electrically coupled to said power plane.

4. The method of claim 1 further including providing third and fourth dielectric layers on said first and second signal layers, respectively, and providing third and fourth conductive layers on said third and fourth dielectric layers, respectively.

5. The method of claim 1 further including positioning adjacent signal lines in each of said first and second signal layers as closely as only about 0.002 inch apart within said signal layers and each of said signal lines within said first signal layer only about 0.005 inch apart from the corresponding signal line within said second signal layer.

6. The method of claim 5 further including providing each of said signal lines at a thickness of from about 0.0005 inch to about 0.002 inch.

7. The method of claim 1 wherein said first and second pluralities of signal lines are formed using conventional photolithographic processing.

8. The method of claim 1 wherein power plane, said first and second dielectric layers positioned on said power plane, and said first and second signal layers having said signal lines formed thereon are bonded together to form said printed circuit board.

9. The method of claim 8 wherein said bonding is accomplished using a lamination process combining heat and pressure.

10. The method of claim 9 wherein said heat applied during said lamination process is within the range of from about 175 degrees Celsius to about 250 degrees Celsius and said pressure applied during said lamination is within the range of from about 100 pounds per square inch to about 1,100 pounds per square inch.

* * * * *